United States Patent
Calvert

(10) Patent No.: US 7,883,656 B2
(45) Date of Patent: Feb. 8, 2011

(54) WOUND IN-SITU MOULDED MAGNET END COIL AND METHOD FOR PRODUCTION THEREOF

(75) Inventor: Simon James Calvert, Witney (GB)

(73) Assignee: Siemens Plc, Frimley, Camberley, Surrey (GB)

( * ) Notice: Subject to any disclaimer, the term of this patent is extended or adjusted under 35 U.S.C. 154(b) by 666 days.

(21) Appl. No.: 11/950,742

(22) Filed: Dec. 5, 2007

(65) Prior Publication Data

US 2008/0164367 A1    Jul. 10, 2008

(30) Foreign Application Priority Data

Dec. 6, 2006    (GB)  ................................. 0624307.5

(51) Int. Cl.
*B32B 37/00*      (2006.01)
(52) U.S. Cl. .................. 264/272.19; 156/169; 156/173; 156/175; 156/245; 335/216; 335/299
(58) Field of Classification Search .................. 156/169, 156/173, 175, 242, 245; 335/216, 299; 264/272.19, 264/281
See application file for complete search history.

(56) References Cited

U.S. PATENT DOCUMENTS 4,800,354 A *   1/1989   Laskaris ...................... 335/216
5,409,558 A *   4/1995   Takahasi et al. ............. 156/245
2007/0257754 A1 *   11/2007   Gilgrass ...................... 335/216

FOREIGN PATENT DOCUMENTS

EP           0602647 A1 *   6/1994

(Continued)

OTHER PUBLICATIONS

Great Britain Search Report dated Apr. 5, 2007 (Three (3) pages).

*Primary Examiner*—Jeff H Aftergut
(74) *Attorney, Agent, or Firm*—Crowell & Moring LLP

(57) ABSTRACT

A method for manufacturing a solenoidal magnet having one or more coils wound onto a cylindrical former, and an annular end coil (20), mounted onto an end of the former such that no part of the former is present on the radially inner (A1) or axially outer (B2) sides of the end coil. The method comprises the steps of: (a) locating a temporary annular mold (22) on the end of the former; (b) retaining (32, 34, 36, 38) the temporary mould in position on the end of the former; (c) providing an interface release material (42) on an end surface of the former, exposed to the interior of the temporary mold; (d) winding wire to form the end coil into the cavity formed by the interior of the mold and the an interface release material (42) on the end surface of the former; (e) providing a step feature (46) over an axially inner part of a radially outer surface of the end coil; (f) providing a retaining strip (48), extending from the former over a radially outer surface of the step feature, and at least partially over an axially outer surface of the step feature, said retaining strip being held onto the former by retaining means (50), so as to retain the step feature in axial compression; (g) impregnating the end coil and the step feature with a hardening liquid impregnating material; and (h) once the impregnating material has hardened, removing the temporary annular mold.

13 Claims, 3 Drawing Sheets

FOREIGN PATENT DOCUMENTS

| GB | 2 267 760 A | | 12/1993 |
| JP | 58-137205 A | * | 8/1983 |
| JP | 03-261110 A | | 11/1991 |
| JP | 05-101922 A | | 4/1993 |
| JP | 2001-6919 A | * | 1/2001 |

* cited by examiner

WOUND IN-SITU MOULDED MAGNET END COIL AND METHOD FOR PRODUCTION THEREOF

The present invention relates to the production of magnet coils. It particularly relates to the production of end coils for solenoidal magnets. In preferred embodiments, it relates to the production of end coils for superconducting magnets used in imaging systems such as nuclear magnetic resonance (NMR) or magnetic resonance imaging (MRI).

BACKGROUND OF THE INVENTION

It is conventional to manufacture solenoidal magnet coils, such as used in imaging systems such as nuclear magnetic resonance (NMR) or magnetic resonance imaging (MRI) by winding wire "in situ" into slots formed in a machined former. It is also known that a required field homogeneity may be more readily achieved by producing end coils of lesser diameter than the diameter of coils located towards the centre of the solenoidal arrangement.

Such arrangements have been achieved by having a former with slots of appropriate position and diameter to locate and retain such coils. However, particularly in the field of superconducting magnets for imaging systems such as nuclear magnetic resonance (NMR) or magnetic resonance imaging (MRI), it is required to reduce the overall length of the solenoidal magnet as far as is possible, to improve access to a human or animal patient, or other object to be imaged, and to reduce claustrophobia of the patient when placed in the imaging system, as well as to reduce the costs of other system components such as cryogen vessel and outer vacuum container, well known in the art. It is further required to reduce, as far as is possible, the length of wire used in winding of the coils. This is primarily due to the high cost of superconductive wire per unit length, but also serves to reduce the weight of the whole system, which in turn reduces the mechanical strength requirement for suspension components, which in turn may be used to reduce the size of the suspension components, reducing thermal influx to the magnet and its cooling system.

A known solution to these requirements involves the use of separately moulded end coils. In such an arrangement, a reduced-length inner former is used, and is not wound with end coils. The inner former is typically an aluminium tube with coils wound into slots formed on its outer surface. The coils are typically resin impregnated in situ. End coils are wound in a separate mould. The end coil thus wound is typically impregnated with a thermosetting resin which is allowed to cure. The moulded coils are then released from the mould to be attached to the end of the inner former as a separate article. Typically, end formers may be provided. These may be accurately-machined mechanical arrangement for supporting the end coils of the inner magnet and outer shield coils. They are attached to the inner former during assembly by any suitably accurate mechanical process, typically by bolting the former parts together. The end coils are typically retained onto the end former by clamp rings. The benefits of such an arrangement include the fact that material of the former is not provided on the inner surface or the end surface of the end coils. The absence of former material on the inner radial surface means that the inner diameter of the end coil may be reduced to the inner diameter of the inner former, reducing the length and so also the cost of superconducting wire required as compared to an arrangement where all coils are wound onto an outer surface of a solid former. The absence of former material on the axial end surface of the end coil means that the overall length of the solenoidal magnet may be reduced by the length dimensions of the former material conventionally provided beyond each axial end of the end coils.

FIG. 1 shows a quarter section of a known arrangement, having coil 20 with an outer crust layer 2, for example, thermosetting resin impregnated with glass fibre or glass beads. This acts as a thermal diffusion barrier. The crust also provides a step feature 3. A structural web 4 is mechanically linked to the former. A thrust ring 5, typically of aluminium alloy, is welded 6 to the web 4. Thrust ring 5 includes an oversleeve which retains the end coil in position. Coil 20 is placed within the thrust ring. Balance shims 9 may be provided to adjust the axial position of the coil, and to compensate for asymmetries between the ends of the magnet. A coil clamp ring 7 bears against the step 3 in crust 2, retaining the coil in position against the thrust ring 5. Fasteners such as bolt 8 press the clamp ring into contact with the step 3. The axis of the solenoidal arrangement is parallel to the line A-A.

The known moulded end coils may suffer from quenches particularly in turns near the coil's inner radius. The field strength is particularly high at the inner radius, possibly double that present at the coil's outer radius.

Moulded coils are known to be relatively inaccurate. This may be caused by differential shrink of the impregnating material during curing. The use of moulded coils mounted onto a former leads to the probability of patchy contact between the coil and the former. In operation, the magnet coils are subjected to very high forces. The patchy contact may cause these forces to deform the coil or the former at points of high local stress. This yielding may cause a quench. The combination of high forces and patchy contact may also combine to cause some circumferential movement of the coil, which again may lead to a quench, or departure of the magnetic field characteristics from the optimal situation. It is accordingly conventional to use shims to ensure a precise tight and accurate fit of the moulded coil to its former.

Balance shims are known in conventional magnet arrangements for adjusting the axial position of outer coils. Typically, resin-impregnated moulded coils are used as end coils. Their axial position may be varied during assembly to improve the bare magnet homogeneity towards the designed specification. Shims of an electrically insulating, non-magnetic material such as Mylar® polyester sheet are placed between the end coil and the former. The number and thickness of the sheets are chosen to adjust the position of the coils to optimise the bare magnet homogeneity. The primary purpose of the axial shims is to correct for error introduced by the use of moulded coils.

Adjacent radial surfaces of the coil and its former may not be circular. The inner diameter of the moulded coil may not be concentric with its outer surface.

It is known to provide an aluminium former oversleeve gripping the coil tightly on its radially outer surface A2 in an attempt to improve quench training behaviour.

However, such arrangements have suffered from certain drawbacks, some of which will now be briefly described.

When the magnet assembly is cooled to operating temperature, which may be as low as 4K, the former, which is typically of aluminium or an aluminium alloy, shrinks in diameter onto the end coil, which is typically primarily of copper. This provides a tight grip of the former onto the coil, intended to retain the coil securely in position. However, this tight grip may in fact be the source of quench events, if the end coil moves during operation—a so-called stick-slip event. The effect of stick-slip events on operation may be reduced by training: repeatedly ramping up and ramping down current in the magnet, so that the coils settle into a stable position.

The moulded end coils have to be wound separately from the rest of the solenoidal magnet, which increases machine set-up time and makes turns balancing more difficult. Turns balancing is the name given to a sequence of steps carried out during the assembly of a magnet, in order to compensate for any deviation of the manufactured magnet from the design, while still achieving approximately the designed magnetic field. The magnet must be assembled with high precision, and take into account the manufacturing tolerances of individual components. Typically, an aluminium former is machined with slots, into which a copper-based superconducting wire is wound.

In one turns balancing sequence, the following steps are performed. The formed dimensions of the slots and the actual cross-section of the wire may combine to mean that the desired number of turns per layer cannot be accommodated, or that a larger number of turns and/or axial shims, will be required to completely fill the axial length of the slot. It is important that each slot be completely filled along its axial length, since any scope for movement may lead to a quench of the magnet in operation. The dimensions of the slots formed in the former are accurately measured, and compared with an accurate measurement of the cross-section to the superconducting wire to be used. The coils are at least partially wound, and then measured for dimensions and number of turns. With these measurements known, a simulation of the finished magnet may be performed to provide a predicted homogeneity. It may be found necessary to vary the number of turns per layer from the design specification in order to completely fill the slot. In this context, attention must be paid to the cross-section of the wire, as this may not be constant along its length, and different numbers of turns may be placed on different layers. Turns can be added or subtracted to/from any of the coils in the magnet to return the predicted magnetic field to its designed bare-magnet homogeneity. It is preferred to add or subtract whole turns only, and it may be necessary to adjust the number of turns on more than one coil to achieve the designed bare-magnet homogeneity without resorting to partial turns. This adjustment of the number of turns on he coils of the magnet in order to achieve a designed magnetic field is known as turns balancing.

If a moulded end coil is used, it cannot take part in turns balancing, but other coils in the magnet need to be adjusted to compensate for any error in the moulded end coils.

Due to tolerance stack-up on the parts of the typical multi-part mould for the end coils, and non-uniform shrinkage of the resin impregnant during gelling, curing and cooling of the end coil, the external cylindrical surface of the finished end coil is typically neither perfectly round, nor concentric with the internal cylindrical surface of the windings of the end coil.

Since the dimensions and the finish of the end coil's surfaces cannot be accurately controlled, it is necessary to use a relatively expensive shimming process to achieve the required tight fit between the end coil and former which retains the remaining coils of the magnet. This is a time-consuming process which is difficult to control. If the fit between the end coils and the former is not sufficiently good, this may lead to quench events. For example, known stick-slip movement of the coil, caused by weak frictional bonds breaking and the coil suddenly moving when in operation can lead to quenches, due to heat generated by friction during the movement of the coil. Similarly, patchy contact of the end coils to the former will produce high local contact stresses, and may deform either or both of the coil and the former. These effects may encourage quench events.

Such drawbacks accumulate such that the end coils are rarely concentric with the rest of the magnet coils, resulting in poor control of transverse homogeneity.

Furthermore, the multi-part mould typically used to form the end coils requires frequent re-coating which adds to the production time and cost.

SUMMARY OF THE INVENTION

One object of the present invention, therefore, is to provide a new end coil structure, and a new method for forming end coils, which retain most of the advantages of separately moulded end coils while at least partially addressing the disadvantages described above.

This and other objects and advantages are achieved by the use of an end coil production method and structure which combines certain features of both the 'wound in-situ' and moulded coil technologies. In particular, the invention provides a method for manufacturing a solenoidal magnet having one or more coils wound onto a cylindrical former, and an annular end coil, mounted onto an end of the former such that no part of the former is present on the radially inner or axially outer sides of the end coil. The method comprises the steps of: (a) locating a temporary annular mould on the end of the former; (b) retaining the temporary mould in position on the end of the former; (c) providing an interface release material on an end surface of the former, exposed to the interior of the temporary mould; (d) winding wire to form the end coil into the cavity formed by the interior of the mould and the an interface release material on the end surface of the former; (e) providing a step feature over an axially inner part of a radially outer surface of the end coil; (f) providing a retaining strip, extending from the former over a radially outer surface of the step feature, and at least partially over an axially outer surface of the step feature, said retaining strip being held onto the former by retaining means, so as to retain the step feature in axial compression; (g) impregnating the end coil and the step feature with a hardening liquid impregnating material; and (h) once the impregnating material has hardened, removing the temporary annular mould.

BRIEF DESCRIPTION OF THE DRAWINGS

The above, and further, objects, characteristics and advantages of the present invention will now be described with reference to certain embodiments of the present invention, given by way of examples only, in conjunction with the appended drawings, wherein.

DETAILED DESCRIPTION OF THE DRAWINGS

It is customary to refer to surfaces of rectangular solenoidal coils as follows. The radially inner and outer surfaces, and radii, are referred to as A1 and A2, respectively. The axially inner and outer surfaces, and positions, are referred to as B1 and B2, respectively. These labels are marked on the appropriate faces of end coil 20 in FIG. 2.

Figure 1:
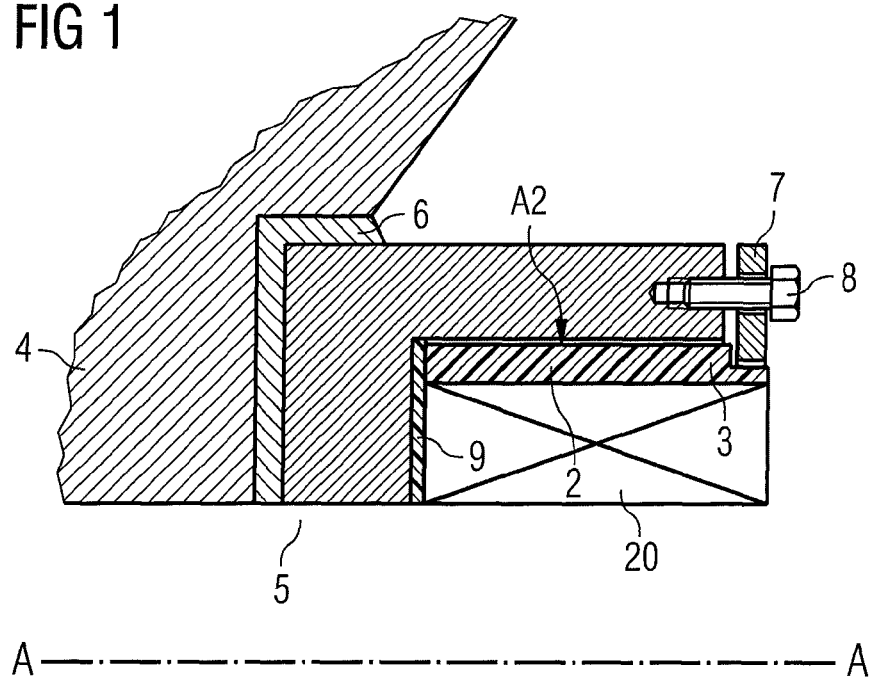
FIG. 1 shows a partial, longitudinal quarter-sectional view of a solenoidal magnet with separately moulded end coils, according to the prior art.
Figure 2:
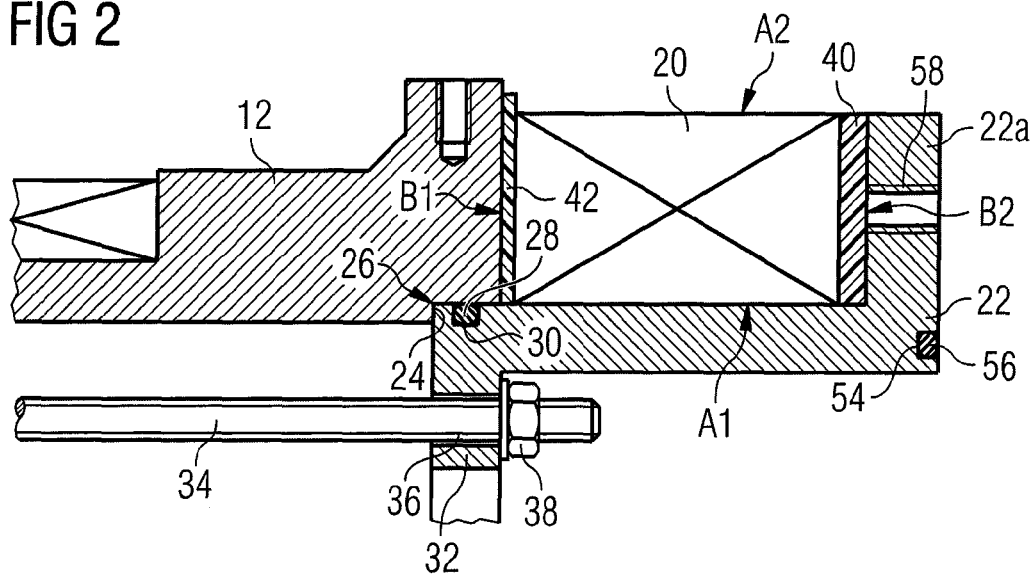
FIGS. 2-5 show partial, longitudinal quarter-sectional views of a solenoidal magnet, illustrating stages in the manufacture of wound in-situ moulded end coils according to an embodiment of the present invention.

As shown in FIG. 2, the present invention provides for end coil 20 to be wound into a temporary mould 22. Preferably, this temporary mould is a single-piece annular temporary mould. This may be achieved by ensuring that the mould may simply be slid away from the former when moulding is finished, by having no raised portions axially closer to the former than the retaining wall 22a for retaining the coil to be wound. In order to achieve the wire consumption reduction and length reduction benefits of moulded end coils, there is no former material under the end coil 20 or on its B2 face when completed.

As illustrated in FIG. 2, the former 12 is provided with a recessed step feature 24 near each end. In this embodiment, the recessed step feature 24 is provided on the radially inner surface of the former, and comprises a region of relatively greater inner radius near the end of the former, and a region of relatively smaller inner radius further from the end of the former. In order to ensure a snug fit with the temporary annular mould 22, the relatively greater inner radius is no greater than the radius of the annular surface of the temporary mould used for defining the radially inner (A1) surface of the end coil. A complementary surface 26 is provided on an axially inner edge of the temporary mould, and the temporary mould may accordingly be pressed onto the end of the former, such that a part of the mould passes inside the former, such that the complementary surface 26 abuts the recessed step feature.

This recessed step feature 24 may continue around the inner circumference of the former 12, or may be intermittent around the inner circumference of the former. The complementary surface 26 on the temporary mould 22 may be continuous or intermittent as appropriate for the step feature 24. A compressible seal 28, most conveniently a continuous O-ring, is preferably provided in a recess 30 in the temporary mould, to prevent leakage of liquid impregnant material from the temporary mould along the inner surface of the former 12. When the temporary mould 22 is in position on the former 12, seal 28 is held in compression between the former 12 and the recess 30.

In alternate embodiments, a similar recessed step feature may be provided on the annular surface of the temporary mould, with a similarly complementary surface provided on an axially outer edge of the former.

The end coils of the present invention may be produced by the following method, described with reference to FIGS. 2-5.

An annular temporary mould 22 is mounted on each end of the former 12 by sliding it into position, with each mould's complementary surface 26 abutting he corresponding step feature 24. Each respective seal 28 is compressed to seal between the former 12 and the respective temporary mould 22. A mechanical retaining means must be provided to hold the temporary moulds 22 in position on the former 12. As illustrated in FIG. 2, this may be conveniently arranged by providing a retaining rim 32 on the temporary mould, extending radially inward preferably on the axially inner B1 extremity of the temporary mould. A plurality of mechanical restraints 34 act in tension between the retaining rims 32 of the opposing temporary moulds, to retain them in position against the former. As shown in FIG. 2, the mechanical restraints may be in the form of threaded bars 34 passing through holes 36 in the retaining rims 32, held under tension by nuts 38 threaded onto the bars and acting against the retaining rims. In place of a retaining rim, individual retaining lugs may be provided around the interior surface of the temporary mould. Such lugs or rims may be pierced to allow passage of a mechanical restraint such as threaded bar 34, or may be provided with U-shaped cut-outs to allow insertion and removal of restraints such as threaded bar 34 and nuts 38 without necessarily removing the nuts from the bar. Other mechanical restraints may be provided, with appropriate interfacing to the temporary mould, and will be apparent to those skilled in the art.

As also shown in FIG. 2, the inner surface of the retaining wall 22a may be lined with a jacking plate 40, whose function will become clear in the following discussion of FIG. 4. The inner surface of the mould intended to form the B1 surface of the end coil 20 may be lined with a low friction interface release material 42 such as MYLAR® polyester sheet or polytetrafluoroethylene PTFE.

The presence of such material will prevent the end coil 20 from adhesively bonding to the former. Such adhesive bonding is to be avoided, since stresses may be produced in the end coil when the former and coils are cooled to operating temperature, and such adhesive bonding may be released while the coil is in operation, which may cause a rapid, although small, movement in the coil, sufficient to cause quench.

With the temporary mould in position, with linings of jacking plate 40 and low friction interface release material 42, winding of the coil 20 itself may proceed. This step is performed as for any standard coil winding. In a preferred embodiment, the coil is wound dry. It may, alternatively, be possible to coat the wire of the coil with a resin immediately prior to winding it, thereby to directly produce a resin-impregnated coil.

The entire solenoidal magnet, end coils 20 as well as the other coils on former 12, may be wound in a single winding process. Once the coils are wound, and referring now to FIG. 3, a thermal diffusion barrier 44, for example of glass tape, is wound on top of the end coils.

In order to retain the end coil 20 in position when in operation, a step feature 46 is produced on axially inner portion of the radially outer A2 surface of the end coil. This may be provided by wrapping a number of layers of fibreglass tape around the relevant part of the radially outer A2 surface of the coil, which is preferably already covered in thermal diffusion barrier 44. A retaining strip 48 is provided, holding the step feature 46 in compression. A rolled edge on the retaining strip will serve to retain the end coil axially. This retaining strip 48 is preferably formed of a resilient sheet material, such as a non-magnetic sheet material. The retaining strip should be coated with a low friction interface release material 42 such as polytetrafluoroethylene PTFE, at least on the surfaces which will bear upon the step feature 46. The retaining strip may be formed as a series of arcs which are arranged around the outer A2 circumference of the end coil 20. A number of retaining means such as screw 50 are provided, compressing the retaining strip onto the step feature 46 so as to retain it in compression.

Since the end coils 20 are wound in-situ, the retaining strip 48 is fitted after winding. The retaining strip may comprise one or more relatively thin rolled clamping arcs, arranged contiguously or intermittently around the perimeter of the end coil. The material, shape and size of the retaining strip may be optimised for each magnet design.

Figure 3:
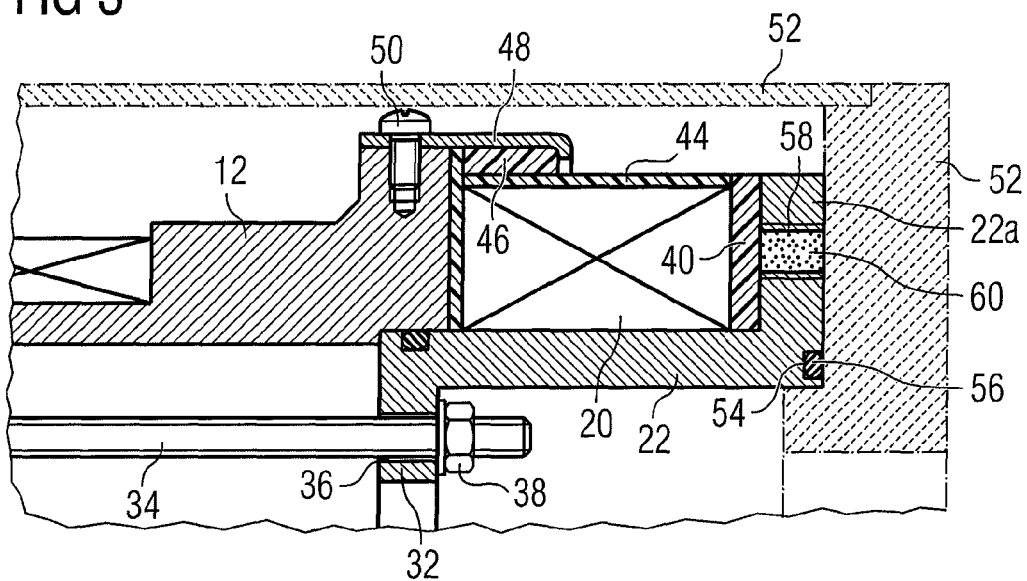

The entire former 12 with coils and end coils 20 can now be vacuum impregnated, for example with a thermosetting resin material. FIG. 3 shows an impregnation tank 52 temporarily fitted on and around the former 12 and the end coil 20. Recess 54 in the end surface of the mould 22 houses a compressible seal 56, which seals against the impregnation tank 52 to prevent or reduce leakage of impregnant material. An aperture 58 is preferably provided in the retaining wall 22a, such that is it covered by the jacking plate 40. During impregnation, the aperture 58 is preferably filled or blocked by a temporary filler material 60 such as modelling clay. In conjunction with the backing plate 40, this filler material 60 prevents impregnant material from entering the aperture 58. Vacuum impregnation of the former 12, the coils and the end coils 20 proceeds as is conventional in the art. Excess impregnating material is stripped away before it has fully hardened.

The impregnating material is prevented from adhesively bonding to the former 12 by the presence of low friction interface release material 42; and is prevented from adhesively bonding to the temporary mould by a release coating, conventional in itself, applied to the surface of the mould 22. The impregnating material is prevented from adhesively bonding to the jacking plate 40 either by the presence of a release coating or by the nature of the material of the jacking plate, or at least the nature of the material of the surface of the jacking plate which enters into contact with the impregnating material. The impregnating material is prevented from adhesively bonding to the retaining strip 48 by the presence of low friction interface release material.

The end coils 20 are held concentric to the former 12 during impregnation by the annular temporary mould 22. The retaining strip 48 and its associated step feature 46 will be individually formed as appropriate to each end coil. This results in accurate placement, in full contact with the former 12 through the low friction interface release material 42. This eliminates the need for positional shimming, and reduces the likelihood of quenching during operation.

Figure 4:
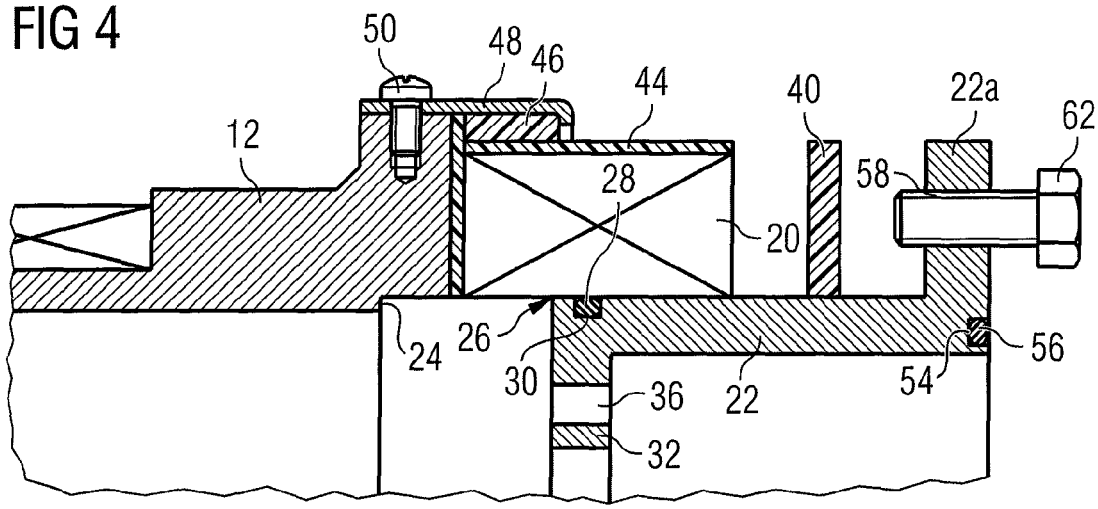

As illustrated in FIG. 4, once the impregnation step is complete, the impregnation tank 52 is removed. The mechanical restraints 34 holding the temporary annular moulds 22 onto the former are removed. Any filler material 60 placed in the apertures 58 is removed. Means are provided for applying force between the mould and the jacking plate, so as to displace the mould away from the jacking plate and the end coil once the impregnating material has hardened, thereby removing the temporary annular mould. Preferably, the aperture 58 is threaded, and threaded tools, which may be simple bolts 62, are screwed into the threaded apertures 58. The threaded tools are of sufficient length to pass through the retaining wall 22a and bear upon the outer surface of the jacking plate 40, and so on the axially outer B2 surface of the impregnated end coil 20. By tightening the threaded tools still further, the annular temporary mould 22 is jacked away from the former 12 and the end coils 20, leaving the end coils 20 held accurately aligned with the former 12 and he remainder of the solenoidal magnet, having a mating surface B1 in full mechanical contact with the former, through the low friction interface release material 42, securely retained in position with no former material on the axially outer B2 or radially inner A1 surfaces, ensuring minimum radius (and so minimum wire requirement) of the end coil, and minimum overall length of the solenoidal magnet.

Figure 5:
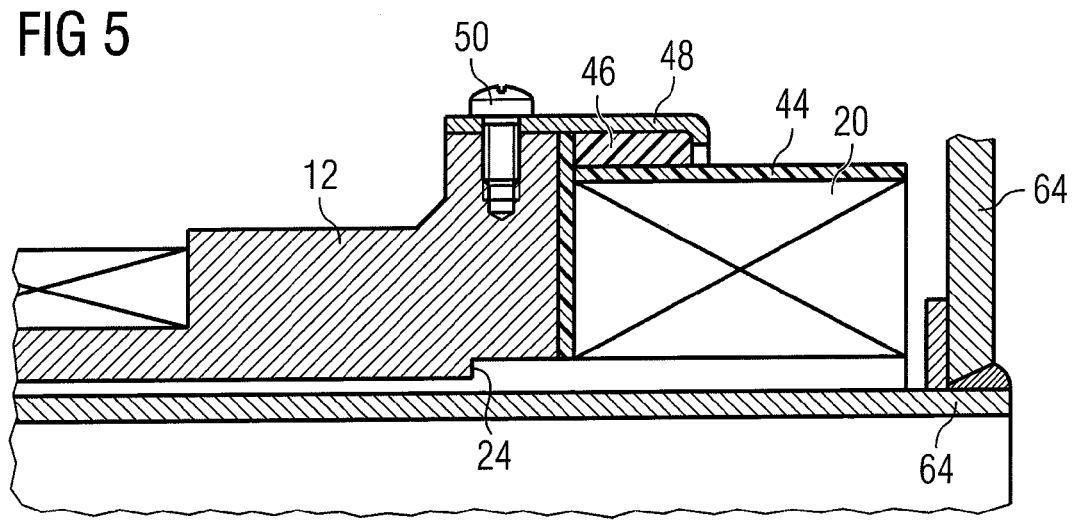

As illustrated in FIG. 5, the former and end coil assembly of FIG. 4 may be assembled into a complete system, such as an imaging system used in nuclear magnetic resonance (NMR) or magnetic resonance imaging (MRI). Foe example, the solenoidal magnet may be encased within a cryogen vessel 64 of conventional construction, for cooling to operational temperature.

According to the method and structure of the present invention, the end coils are held accurately concentric with the former on the radially outer A2 surface of the end coils, which is preferred since the superconducting state of the wire is most stable on this surface, as the field strength is generally lowest here for a solenoidal magnet design.

According to the method and structure of the present invention, the entire solenoidal magnet, comprising coils on the former 12 and end coils 20 can now be wound in a single process on a single winding machine and turns balanced as required. An example of turns balancing is provided earlier in the present text.

The method and structure of end coil formation according to the present invention provides at least the following benefits.

The whole solenoidal magnet, including former 12 and end coils 20, can be wound in a single winding operation.

End coil fitting to the former, and positional shimming, operations required in conventional separately moulded end coil arrangements, are eliminated.

Transverse bare magnet homogeneity will be improved as compared to conventional separately moulded end coil arrangements, since the alignment and position of the end coil is fixed by accurate interfacing with the former. The method of the invention also assures accurate formation of the end coils during manufacture.

The cost of the annular temporary mould 22 and the cost of re-coating it are reduced as compared to conventional separately moulded end coil arrangements, due to the mould comprising fewer components than is conventional.

The reduced wire consumption advantages are the same as for the conventional separately moulded coil approach.

The former 12 can be made shorter so requiring less machining, and so of reduced cost as compared to end coils wound on the former, as for the conventional separately moulded coil approach.

The method and apparatus of the present invention may be applied to current products within existing cryogen vessels 64, since the dimensions of a magnet assembly are no larger than for those produced by the conventional separately moulded coil approach.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A method for manufacturing a solenoidal magnet having one or more coils wound onto a cylindrical former, and an annular end coil mounted onto an end of the former such that no part of the former is present on the radially inner or axially outer sides of the end coil, wherein the method comprises the steps of:
   (a) locating a temporary annular mould on the end of the former;
   (b) retaining the temporary mould in position on the end of the former;
   (c) providing an interface release material on an end surface of the former, exposed to the interior of the temporary mould;
   (d) winding wire to form the end coil into the cavity formed by the interior of the mould and the an interface release material on the end surface of the former;
   (e) providing a step feature over an axially inner part of a radially outer surface of the end coil;
   (f) providing a retaining strip, extending from the former over a radially outer surface of the step feature, and at least partially over an axially outer surface of the step feature, said retaining strip being held onto the former by retaining means, so as to retain the step feature in axial compression;
   (g) impregnating the end coil and the step feature with a hardening liquid impregnating material; and (h) once the impregnating material has hardened, removing the temporary annular mould.

2. A method according to claim 1, wherein the mould has an annular surface for defining the radially inner surface of the end coil, and a retaining wall for defining the axially outer surface of the end coil, and wherein the axially inner surface of the end coil is defined by the end of the former, and the interface release material on the end surface of the former.

3. A method according to claim 1, wherein a thermal diffusion barrier is wound over the radially outer surface of the end coil, prior to the provision of the step feature.

4. A method according to claim 1, wherein the step of impregnating comprises:
    placing an impregnation tank around the former and the end coils;
    introducing impregnating material under a vacuum until all coils and the step feature are impregnated with impregnating material; and
    removing excess impregnating material and the impregnation tank before the impregnation material has fully hardened.

5. A method according to claim 1, wherein the step of impregnating comprises:
    coating the wire used to form the end coil in impregnating material prior to winding, such that the end coil is impregnated with impregnating material as it is wound; and
        the step feature is formed by winding an impregnated material around the end coil, such that the step feature is impregnated as it is wound.

6. A method according to claim 2, wherein the step of locating the temporary annular mould on the end of the former is achieved by the following steps:
    providing a recessed step feature on the radially inner surface of the former, comprising a region of relatively greater inner radius near the end of the former, and a region of relatively greater radius further from the end of the former, the relatively greater inner radius being no greater than the radius of the annular surface of the temporary mould for defining the radially inner surface of the end coil;
    providing a complementary surface on an axially inner edge of the temporary mould; and
    pressing the temporary mould onto the end of the former, such that a part of the mould passes inside the former, such that the complementary surface abuts the recessed step feature.

7. A method according to claim 2, wherein the step of locating the temporary annular mould on the end of the former is achieved by the following steps:
    providing a recessed step feature on the radially outer surface of the temporary mould, comprising a region of relatively lesser outer radius near the axially inner extremity of the mould, and a region of relatively greater outer radius further from the axially inner extremity of the mould; wherein the relatively lesser outer radius is no less than the inner radius of the former;
    providing a complementary surface on an axially outer edge of the former; and
    pressing the temporary mould onto the end of the former, such that a part of the mould passes inside the former, such that the complementary surface abuts the recessed step feature.

8. A method according to claim 6, wherein the recessed step feature and/or the complementary surface is intermittent around the inner circumference of the former.

9. A method according to claim 6, wherein the temporary mould is retained in position by mechanical retaining means.

10. A method according to claim 9, wherein a temporary mould is placed at either end of a solenoidal former, and a mechanical restraint is used to pull the temporary moulds towards one another, holding them against the ends of the former.

11. A method according to claim 1, wherein the step feature is formed by winding layers of cloth around the axially inner part of the outer radial surface of the end coil.

12. A method according to claim 1, wherein:
    the mould has an annular surface for defining the radially inner (A1) surface of the end coil, and a retaining wall for defining the axially outer (B2) surface of the end coil;
    a jacking plate is provided within the mould, the jacking plate having an axially outer surface abutting the axially inner surface of the retaining wall and covering the axially inner surface of the retaining wall;
    an aperture is provided in the retaining wall, covered by the jacking plate;
    means are provided for applying force between the mould and the jacking plate, so as to displace the mould away from the jacking plate and the end coil once the impregnating material has hardened, thereby removing the temporary annular mould.

13. A method according to claim 12, wherein the means for applying force between the mould and the jacking plate comprise a thread in the aperture, and a threaded tool mating with the thread, such that the threaded tool may be screwed into and through the aperture, to apply the required force.

\* \* \* \* \*